United States Patent
Tang et al.

(10) Patent No.: US 10,050,528 B2
(45) Date of Patent: Aug. 14, 2018

(54) CURRENT DISTRIBUTION IN DC-DC CONVERTERS

(71) Applicant: Infineon Technologies Austria AG, Villach (AT)

(72) Inventors: Benjamim Tang, Rancho Palos Verdes, CA (US); Allen Sakai, Rancho Palos Verdes, CA (US); Scott Kawaguchi, Placentia, CA (US); Emil Todorov, Fremont, CA (US)

(73) Assignee: Infineon Technologies Austria AG, Villach (AT)

( * ) Notice: Subject to any disclaimer, the term of this patent is extended or adjusted under 35 U.S.C. 154(b) by 244 days.

(21) Appl. No.: 14/753,995

(22) Filed: Jun. 29, 2015

(65) Prior Publication Data
US 2016/0380538 A1  Dec. 29, 2016

(51) Int. Cl.
| | |
|---|---|
| *H05K 7/00* | (2006.01) |
| *H02M 3/158* | (2006.01) |
| *H02M 3/00* | (2006.01) |
| *H05K 3/42* | (2006.01) |

(52) U.S. Cl.
CPC ......... *H02M 3/158* (2013.01); *H02M 3/1584* (2013.01); *H02M 3/00* (2013.01); *H05K 3/42* (2013.01)

(58) Field of Classification Search
CPC ...... H02M 3/00; H02M 3/1584; H02M 3/158; H05K 3/42
USPC ................................ 361/783; 174/250, 262
See application file for complete search history.

(56) References Cited

U.S. PATENT DOCUMENTS

| | | | | |
|---|---|---|---|---|
| 8,598,857 | B2* | 12/2013 | Pierson | H02M 3/1584 323/272 |
| 2001/0035746 | A1 | 11/2001 | Burstein et al. | |
| 2002/0064029 | A1 | 5/2002 | Pohjonen | |
| 2004/0140877 | A1* | 7/2004 | Nakao | H01F 19/08 336/200 |
| 2006/0113657 | A1* | 6/2006 | Ejury | H01L 23/50 257/691 |
| 2007/0257761 | A1* | 11/2007 | Mano | H01F 17/0006 336/200 |
| 2008/0169896 | A1* | 7/2008 | Edo | H01F 17/0033 336/200 |

(Continued)

FOREIGN PATENT DOCUMENTS

| | | |
|---|---|---|
| CN | 100414697 C | 8/2008 |
| CN | 100521197 C | 7/2009 |
| CN | 102918608 A | 2/2013 |

*Primary Examiner* — James Wu
(74) *Attorney, Agent, or Firm* — Murphy, Bilak & Homiller, PLLC

(57) ABSTRACT

A DC-DC converter includes a substrate having opposing first and second sides, a power stage attached to the first side of the substrate and having active semiconductor components operable to provide an output phase of the DC-DC converter, an inductor attached to the first side of the substrate and electrically connected to the power stage through a first metal trace at the first side of the substrate, and a plurality of electrically conductive vias extending through the substrate from the first side to the second side. The vias are electrically connected to the first metal trace. At least some of the vias are disposed at least partly under the power stage. A corresponding method of assembling such a DC-DC converter also is disclosed.

14 Claims, 14 Drawing Sheets

(56) References Cited

U.S. PATENT DOCUMENTS

| | | | |
|---|---|---|---|
| 2011/0228507 A1* | 9/2011 | Yin | H01L 23/495 |
| | | | 361/811 |
| 2012/0069529 A1* | 3/2012 | Chen | H01L 23/552 |
| | | | 361/729 |
| 2015/0116972 A1* | 4/2015 | Todorov | H02M 3/00 |
| | | | 361/782 |
| 2016/0164417 A1* | 6/2016 | Ishii | H01L 25/00 |
| | | | 323/271 |

* cited by examiner

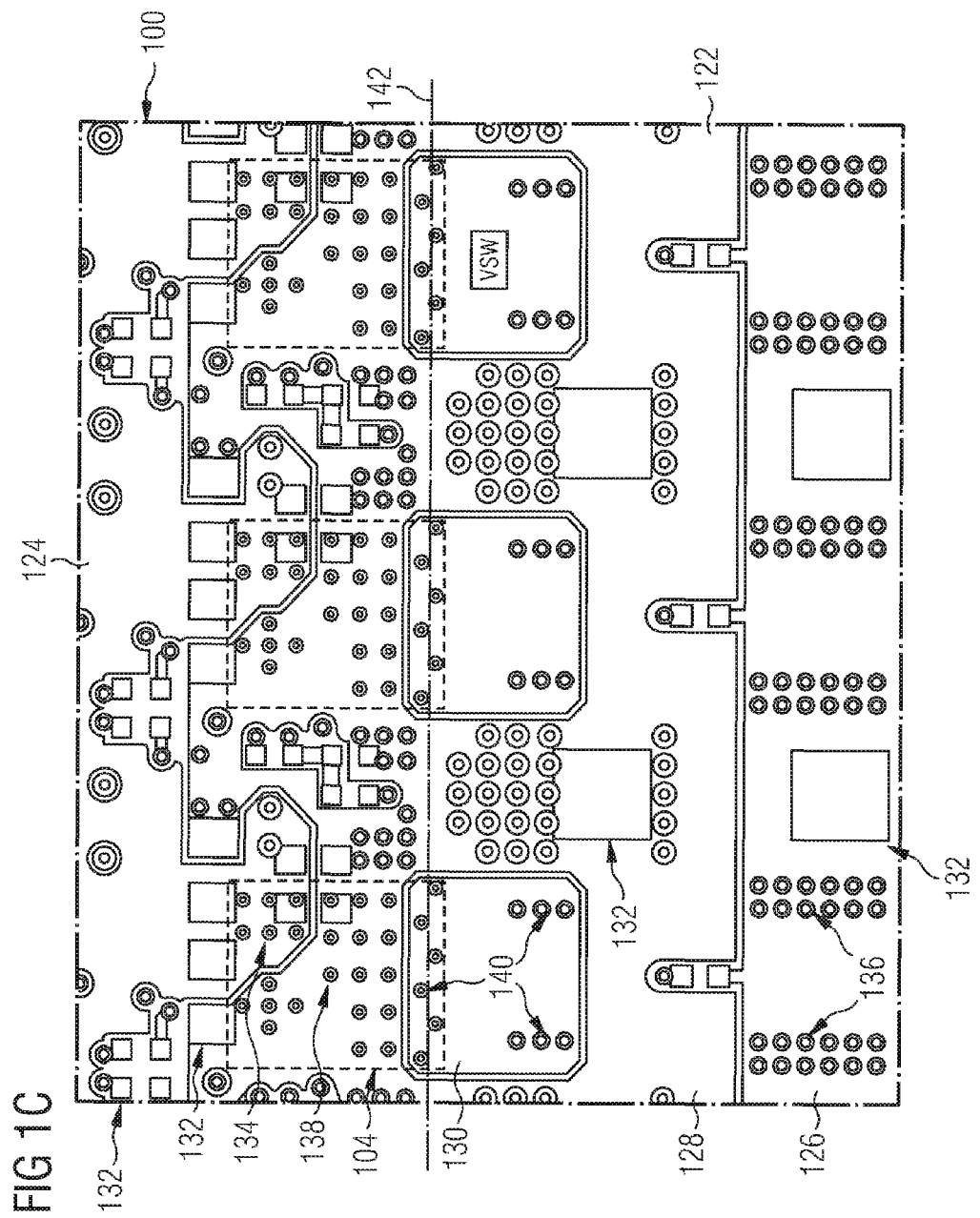

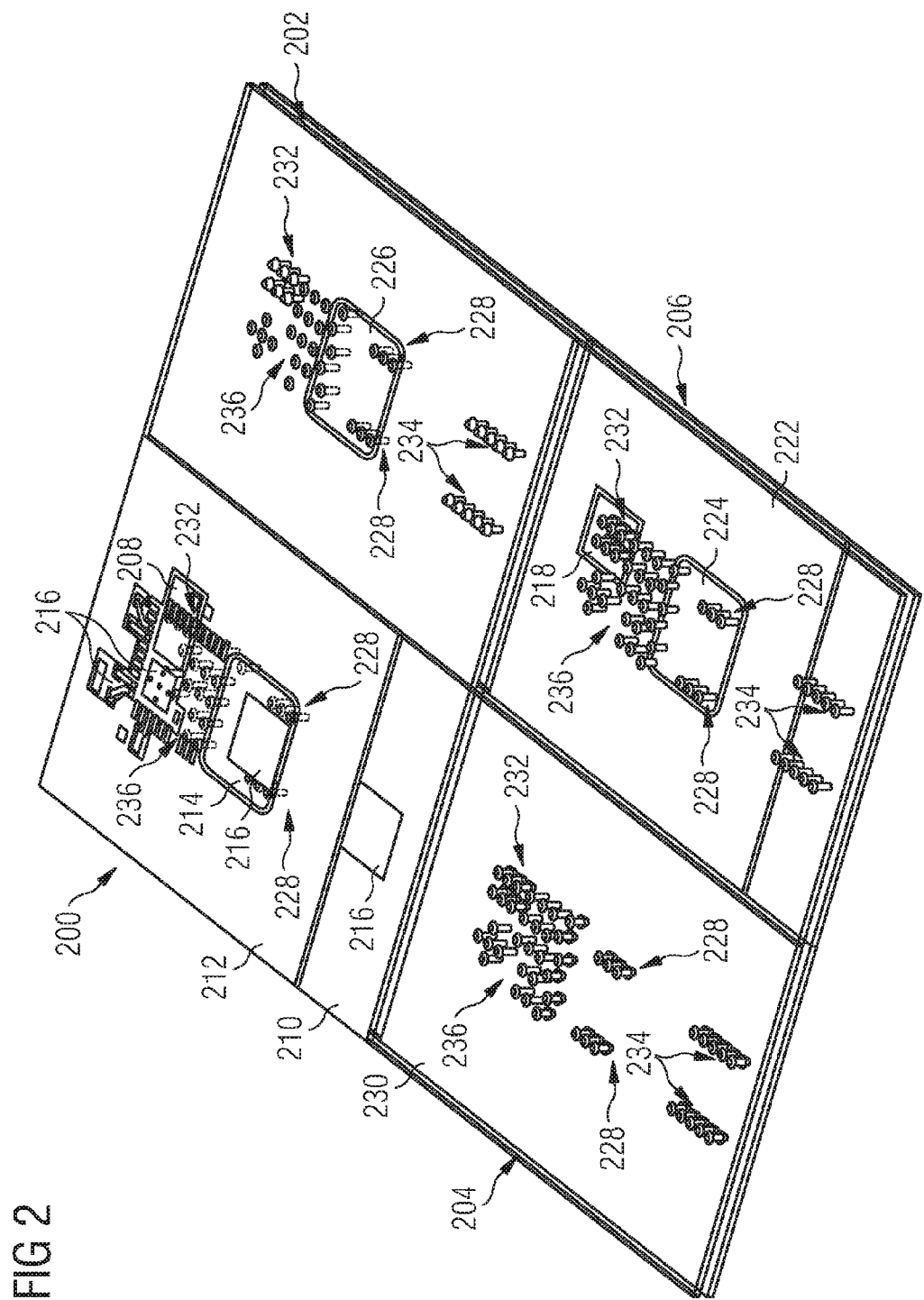

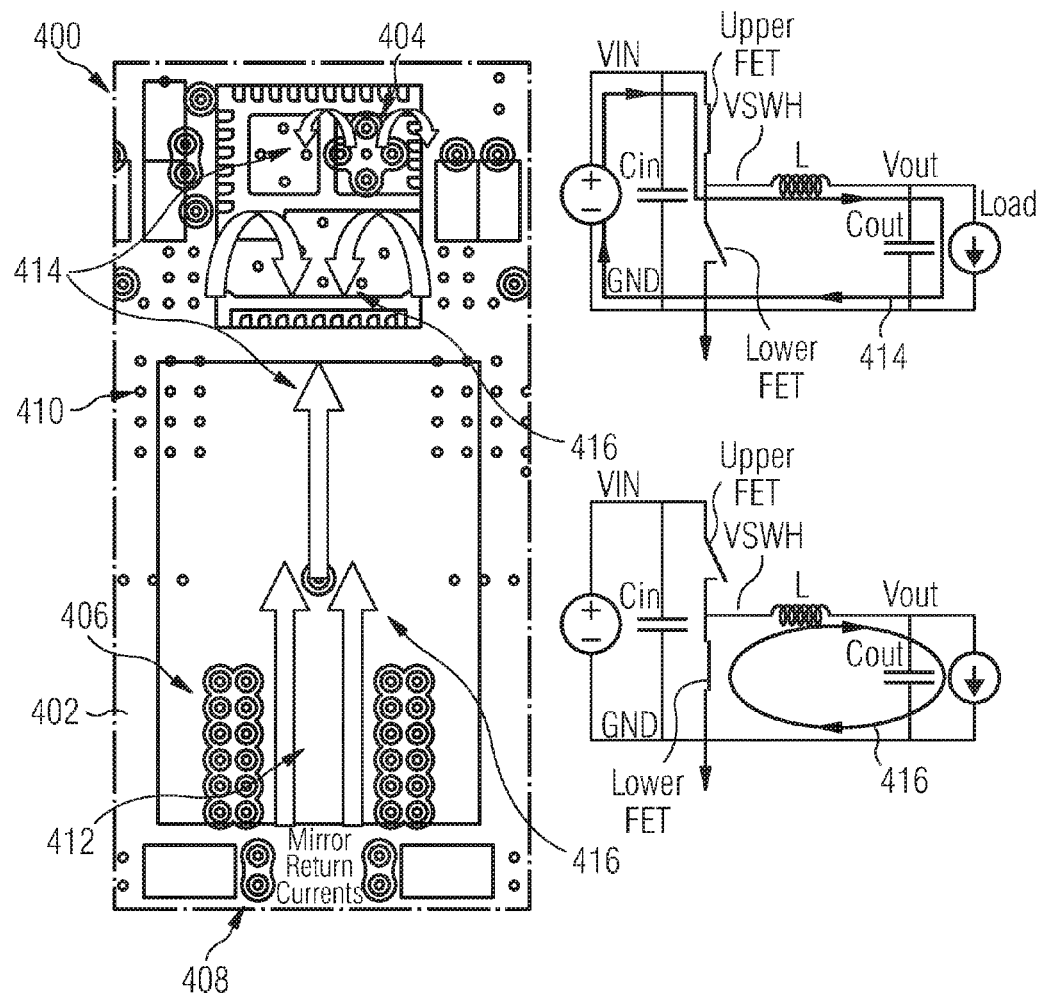

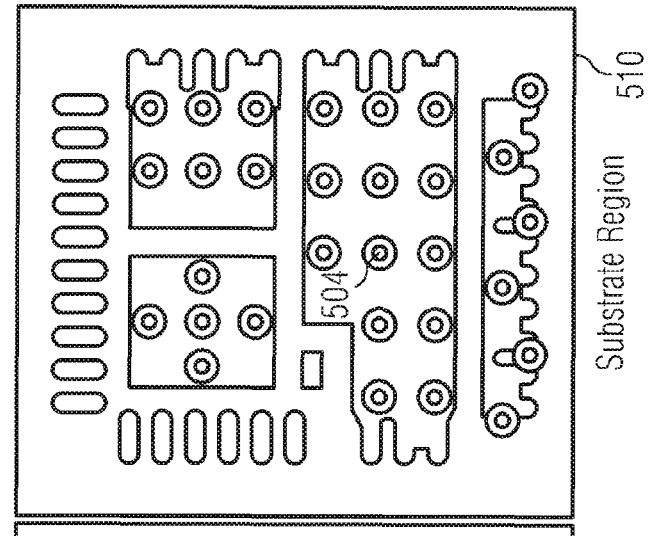
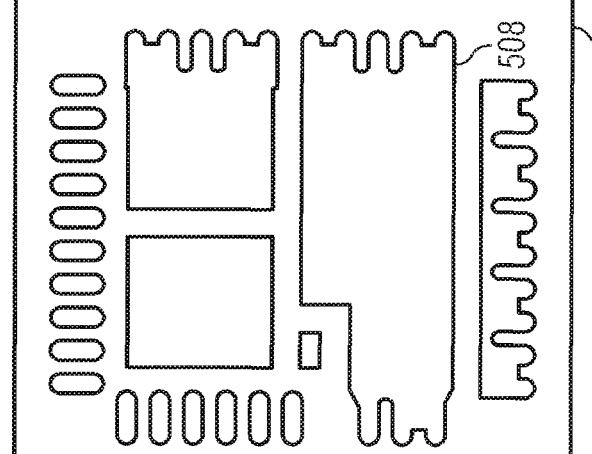
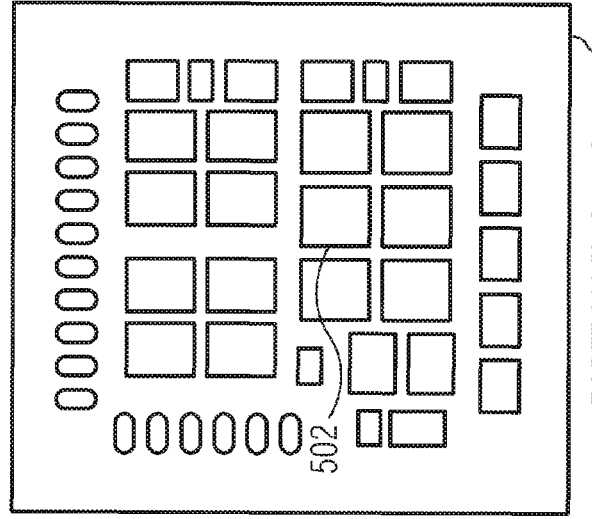

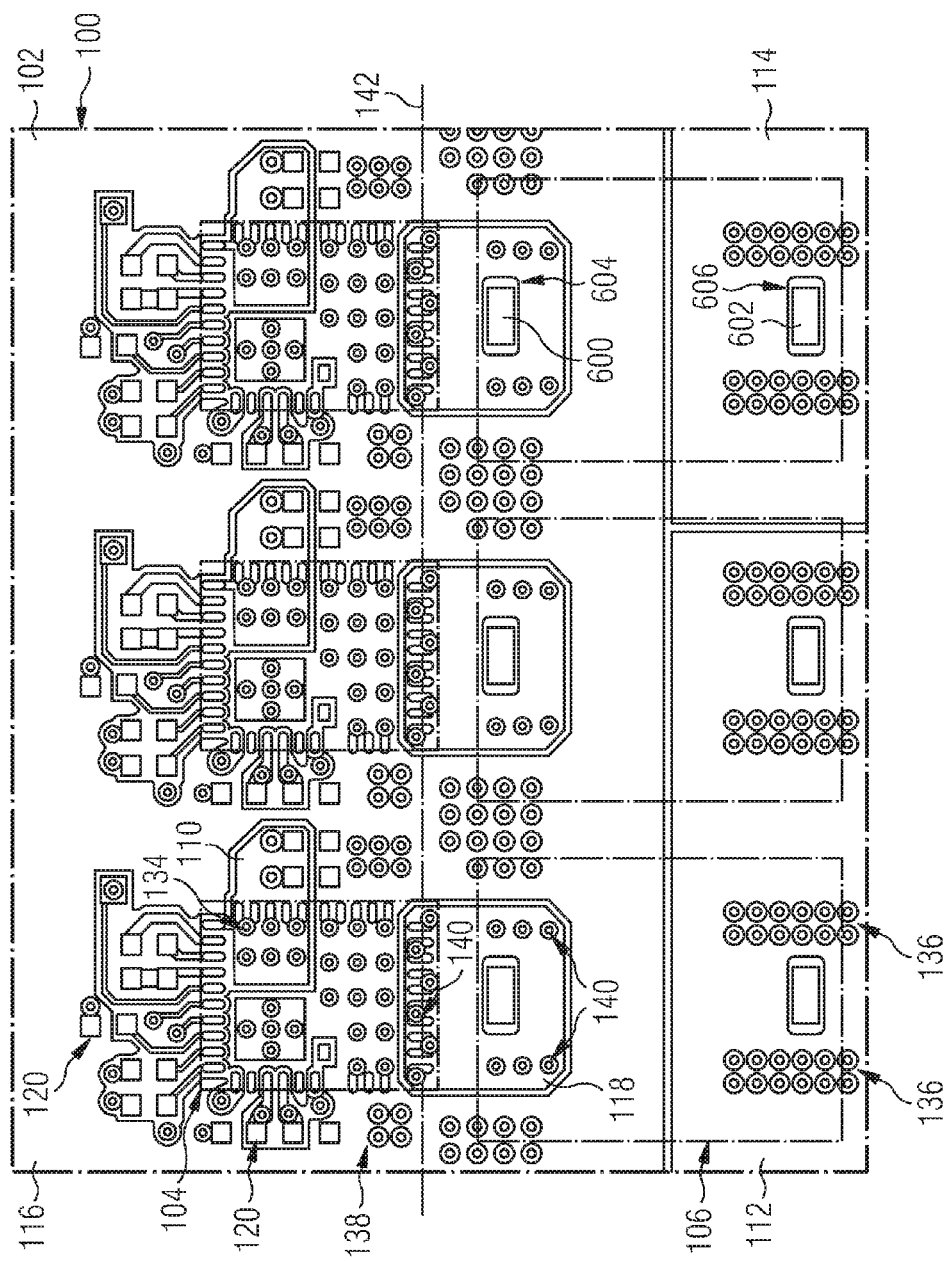

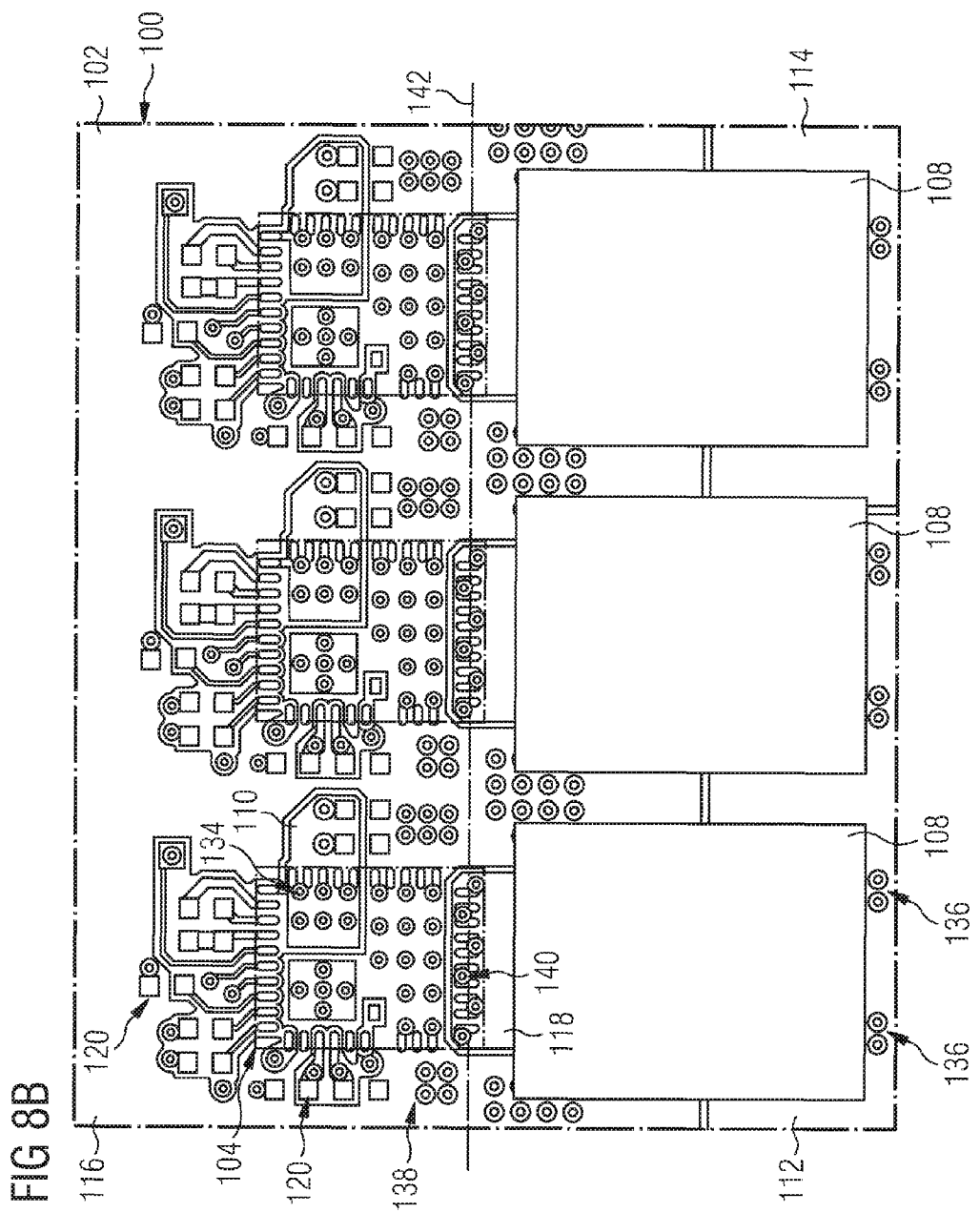

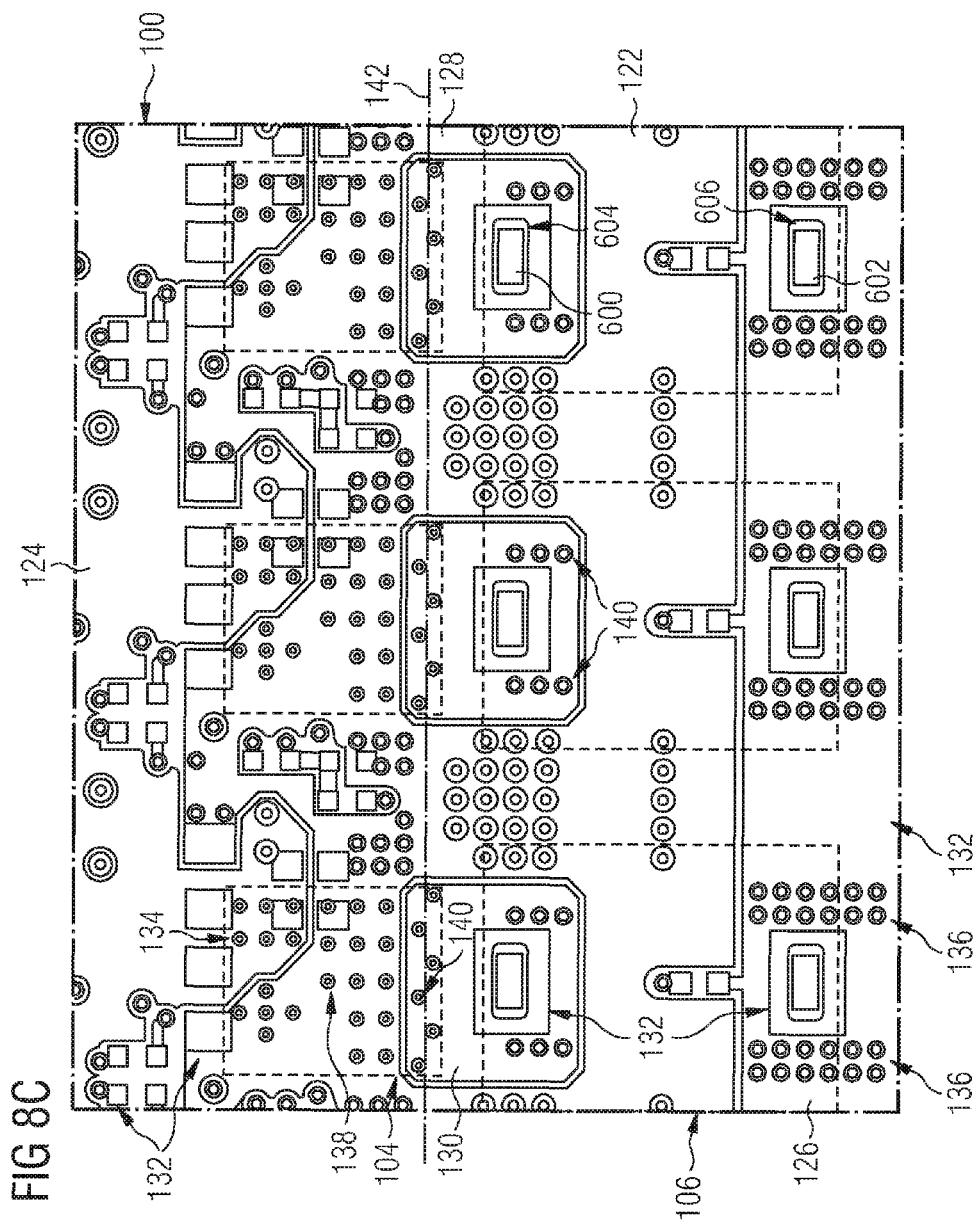

ary layer of the substrate.

CURRENT DISTRIBUTION IN DC-DC CONVERTERS

TECHNICAL FIELD

The instant application relates to DC-DC converters, and more particularly to current distribution in DC-DC converters.

BACKGROUND

DC-DC converters include active and passive components, including power stage components such as high-side and low-side power transistors, for regulating the voltage of a load such as a processor. Each high-side/low-side power transistor pair forms an output phase of the DC-DC converter which is coupled to the load through a corresponding output inductor. The components of a DC-DC converter, including the power stage components and the output inductors, are attached to a printed circuit board (PCB) together with the load. The PCB has various electrical pathways for electrically interconnecting the DC-DC converter components, including electrically connecting the power stage transistors of the converter to the load. Significant waste heat is expelled by the power stage components and output inductors during operation. Transfer of this heat energy from each power stage and output inductor to the PCB is a critical design consideration.

SUMMARY

According to an embodiment of a DC-DC converter, the DC-DC converter comprises a substrate having opposing first and second sides, a power stage attached to the first side of the substrate and comprising active semiconductor components operable to provide an output phase of the DC-DC converter, an inductor attached to the first side of the substrate and electrically connected to the power stage through a first metal trace at the first side of the substrate, and a plurality of electrically conductive vias extending through the substrate from the first side to the second side. The vias are electrically connected to the first metal trace. At least some of the vias are disposed at least partly under the power stage.

According to an embodiment of a method of assembling a DC-DC converter, the method comprises: providing a substrate having opposing first and second sides and a plurality of electrically conductive vias extending through the substrate from the first side to the second side; attaching a power stage to the first side of the substrate so that at least some of the vias are disposed at least partly under the power stage, the power stage comprising active semiconductor components operable to provide an output phase of the DC-DC converter; attaching an inductor to the first side of the substrate so that the inductor is electrically connected to the power stage through a first metal trace at the first side of the substrate; and electrically connecting the first metal trace to the second side through the electrically conductive vias.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1C illustrates a plan view of a section of the bottom outer layer of the substrate.

FIG. 2 illustrates a side-by-side layer view of a circuit board to which components of a DC-DC converter power stage are to be attached, according to an embodiment.

FIG. 4 illustrates a plan view of an intermediary layer of a circuit board to which power stages and corresponding inductors of a DC-DC converter are to be attached, according to an embodiment.

FIGS. 5A through 5C illustrate an embodiment of soldering power stages of a DC-DC converter to a side of a substrate, according to an embodiment.

FIG. 8A illustrates a plan view of a section of a top outer layer of a substrate such as a PCB to which power stage components of a DC-DC converter are attached, according to an embodiment.

FIG. 8B illustrates a plan view of the section of the top outer layer of the substrate shown in FIG. 8A, after attachment of the output inductors.

FIG. 8C illustrates a plan view of a section of the bottom outer layer of the substrate of FIG. 8A.

DETAILED DESCRIPTION

According to embodiments described herein, a DC-DC converter includes at least one power stage having a high-side power transistor and a low-side power transistor. The power transistors can be integrated in the same semiconductor die or in different dies. In either case, each high-side power transistor switchably connects the load to an input voltage of the DC-DC converter, and the corresponding low-side power transistor switchably connects the load to ground at different periods. Each power stage die can be a bare die i.e. an unpackaged die or a packaged die such as a molded die package or an open cavity die package, and each pair of high-side and low-side power stage transistors forms an output phase of the DC-DC converter. Each output phase is coupled to the load by a respective inductor. In the case of a single pair of high-side and low-side power stage transistors, the DC-DC converter is a single-phase converter. In the case of two or more pairs of high-side and low-side power stage transistors, the DC-DC converter is a multi-phase converter.

In either the single-phase or multi-phase case, each power stage die and corresponding output inductor are attached to a substrate such as a PCB. Vias extend through the substrate from one side of the substrate to the other side. Metal traces are provided on the side of the substrate to which the power stage(s) and inductor(s) are attached. The metal traces are spaced apart and electrically isolated from one another, and provide input, output, ground and switched voltage connection points on the substrate for the power stage components.

Some of the vias are electrically connected to the switched voltage trace i.e. the metal trace to which the output of a power stage and a terminal of the corresponding inductor are attached. These vias extend through the substrate to a corresponding metal trace at the opposite side of the substrate. At least some of the vias electrically connected to the switched voltage trace are disposed at least partly under the power stage so as to enhance the transfer of heat energy from that power stage to the backside of the substrate. The switched voltage trace can be replicated in one or more intermediary layers of the PCB and electrically connected to the same group of vias as the switched voltage trace at the front side of the substrate, to reduce the resistance of this electrical pathway.

Figure 1A:
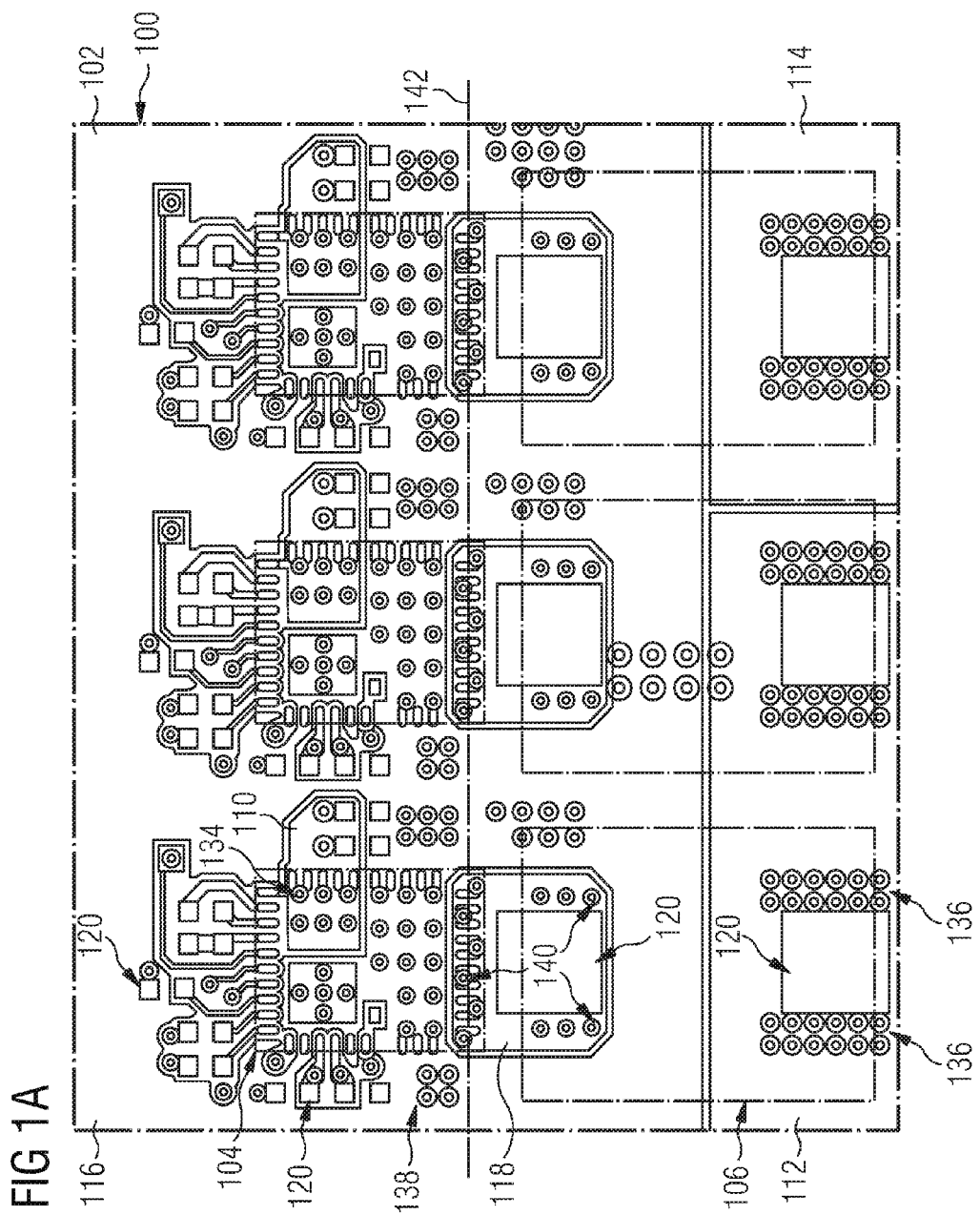
FIG. 1A illustrates a plan view of a section of a top outer layer of a substrate such as a PCB to which power stage components of a DC-DC converter are attached, according to an embodiment.

FIG. 1A illustrates a top plan view of a section of the front side 102 of a substrate 100 such as a PCB (printed circuit board) to which power stage components of a DC-DC converter are to be attached. FIG. 1A illustrates the substrate 100 prior to attachment of the power stage components. As such, only the footprints 104, 106 of each power stage and corresponding output inductor, respectively, are shown in FIG. 1A. The footprints for the other power stage components such as the passive components are not shown in FIG. 1A for ease of illustration.

Each power stage is to be attached to the front side 102 of the substrate 100 and comprises active semiconductor components operable to provide an output phase of the DC-DC converter. The DC-DC converter has more than one phase as shown. In general, the DC-DC converter can be a single-phase or a multi-phase converter as explained above. For example, the section of the substrate 100 shown in FIG. 1A corresponds to two phases of a multi-phase converter on the left side and one phase on the right side where the physical layout of each phase can be identical or different to what is shown in FIG. 1A. The DC-DC converters can have more or less phases. Also, the output phase layout shown in FIG. 1A can be replicated for each phase of a multi-phase converter or isolated as shown on the right that is assigned to a different output voltage (different loop) and therefore the output phases can have different layouts.

Figure 1B:
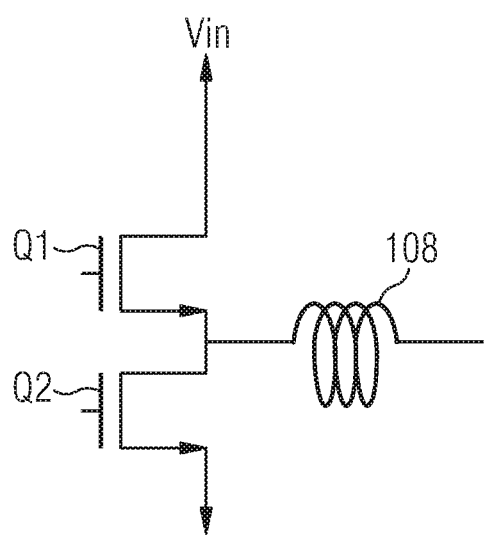
FIG. 1B illustrates a circuit schematic of an output phase of the DC-DC converter.

The power stage components of the DC-DC converter include input capacitors, output capacitors, a power stage for each phase of the DC-DC converter and which includes a pair of high-side and low-side power transistors, and an inductor for electrically connecting the corresponding power stage to the load regulated by the DC-DC converter. Each pair of high-side and low-side transistors can be integrated in the same semiconductor die or disposed in separate dies to form one output phase of the DC-DC converter, which is electrically connected to the load by an inductor. A corresponding circuit schematic of one phase formed by a high-side transistor Q1, a low-side transistor, and an inductor 108 is shown in FIG. 1B. The load can be a high-performance integrated circuit such as a microprocessor, graphics processor, network processor, etc. or other type of integrated circuit requiring voltage regulation such as a POL (point-of-load). The section of the substrate 100 to which the load is to be attached is not shown in FIG. 1A for ease of illustration.

The front side 102 of the substrate 100 includes various metal traces such as copper traces for electrically connecting the power stage components. The metal traces are separated from one another to prevent shorting. For each phase of the DC-DC converter, the metal traces include an input voltage trace 110 which is at the input voltage potential (VIN) of the DC-DC converter, an output voltage trace 112/114 which is at the regulated output voltage potential (Vout) of the DC-DC converter, one or more ground traces 116 which are at ground potential, and a switched voltage trace 118 electrically connected to the switched voltage output of a power stage. The front side 102 of the substrate 100 also includes various attach regions or pads 120 for attaching different power stage components of the DC-DC converter to the front side 102 of the substrate 100. In the case of a PCB, the front side 102 of the substrate 100 corresponds to the top outer layer of the PCB.

Input capacitors of each phase are connected between the input voltage trace 110 and a ground trace 116 at the front side 102 of the substrate 100. Output capacitors of each phase are connected between the output voltage trace 112 and a ground trace 116. The input node of high-side power transistor Q1 of each phase is connected to the input voltage trace 110, so that the high-side power transistor Q1 can switchably connect the load to the input voltage VIN of the DC-DC converter. The input node of low-side power transistor Q2 of each phase is connected to one of the ground traces 116, so that the low-side power transistor Q2 can switchably connect the load to ground at different periods than when the high-side power transistor Q1 is active. The output node of both power transistors Q1, Q2 is connected to the switched voltage trace 118. One terminal of the inductor is attached to the switched voltage trace 118 and the other terminal of the inductor is attached to the output voltage trace 112, so that the output node of the power transistors Q1, Q2 is electrically connected to the output voltage trace 112 on the substrate through the inductor. A plurality of vias extend through the substrate 100 from the front side 100 to the back side 122 for providing electrical and thermal pathways through the substrate 100.

FIG. 1C shows the back side 122 of the substrate 100, prior to power stage component attachment. The back side 122 of the substrate 100 also has various metal traces 124, 126, 128, 130 such as copper traces which correspond to the input voltage trace 110, output voltage trace 112, ground trace(s) 128, and switched voltage trace 130, respectively, disposed at the front side 102 of the substrate 100. In one embodiment, the switched voltage trace 130 disposed at the back side 122 of the substrate 100 is vertically aligned with and has the same footprint (shape) as the switched voltage trace 118 disposed at the front side 102 of the substrate 100.

The back side 122 of the substrate 100 also has various attach regions or pads 132 for attaching different power stage components of the DC-DC converter to the back side 122 of the substrate 100. In the case of a PCB, the back side 122 of the substrate 100 corresponds to the bottom outer layer of the PCB. The footprint of the power stages which are to be attached to the front side of the substrate 100 are illustrated with dashed boxes 104 in FIG. 1C, to highlight their position relative to the metal traces 124, 126, 128, 130 at the back side 122 of the substrate 100.

A first group of vias 134 electrically connect the input voltage trace 110 at the front side 102 of the substrate 100 to the corresponding input voltage metal trace 124 at the back side 122 of the substrate 100. A second group of vias 136 electrically connect the output voltage trace 112 at the front side 102 of the substrate 100 to the corresponding output voltage metal trace 126 at the back side 122 of the substrate 100. A third group of vias 138 electrically connect the ground trace(s) 116 at the front side 102 of the substrate 100 to the corresponding ground metal trace(s) 128 at the back side 122 of the substrate 100. A fourth group of vias 140 electrically connect the switched voltage trace 118 at the front side 102 of the substrate 100 to the corresponding switched voltage trace 130 at the back side 122 of the substrate 100. At least some of the vias 140 in the fourth group are disposed at least partly under the power stage as indicated by the power stage footprints 104 shown in FIGS. 1A and 1C. The vias 140 at least partly disposed under the power stage(s) enhance the transfer of heat energy from the power stage(s) to the back side 122 of the substrate 100. In one embodiment, the vias 140 disposed at least partly under the power stage are arranged in a staggered manner i.e. positioned on or as if on alternating sides of a center line 142.

Figure 1D:
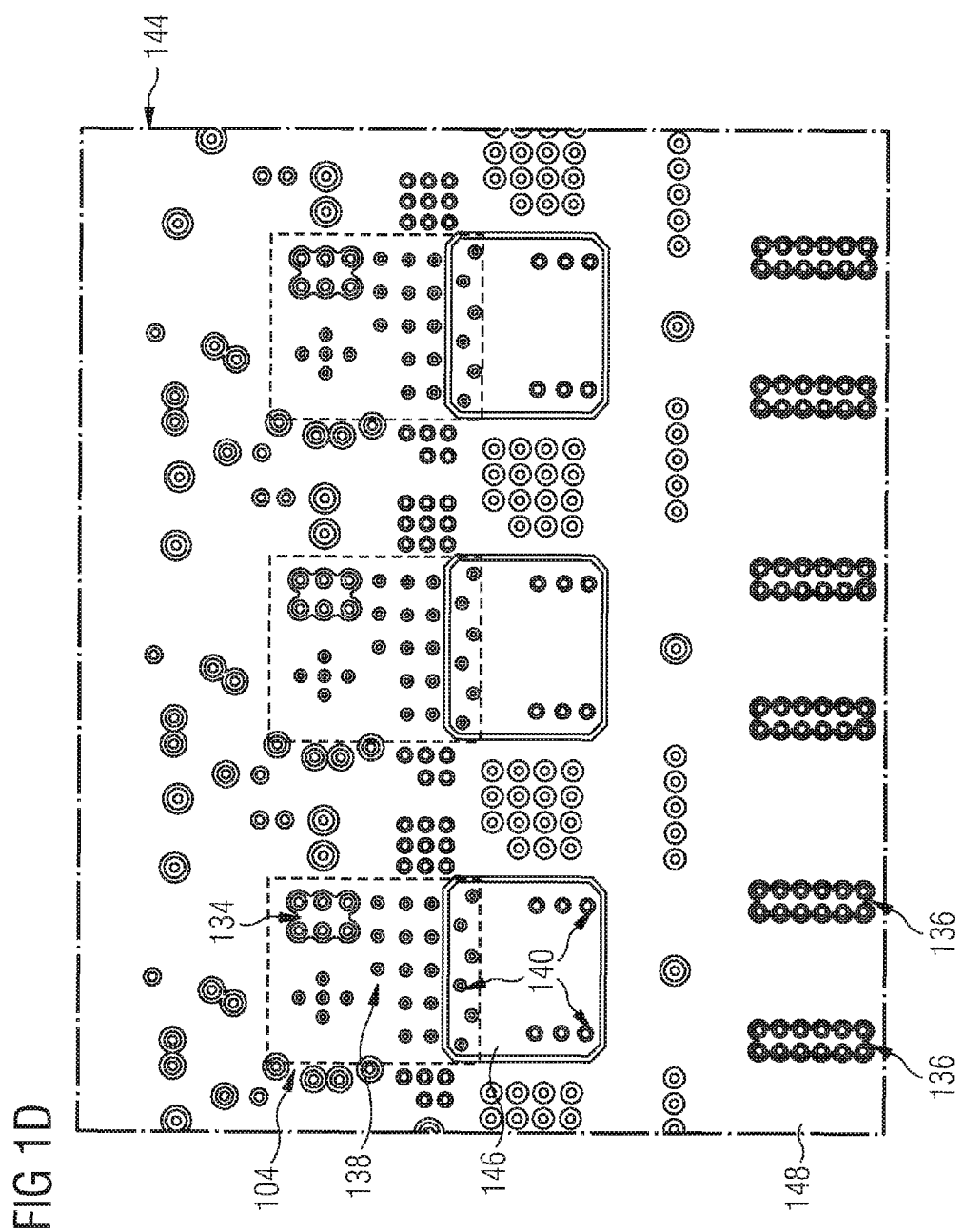
FIG. 1D illustrates a plan view of a section of an intermediary layer of the substrate.

FIG. 1D shows a top plan view of an intermediary layer 144 of the substrate 100 e.g. in the case of a PCB. A circuit board such as a PCB typically has several intermediary layers interposed between the top and bottom outer layers. For example, a circuit board can have 10, 20, 30 or more layers. Some of the intermediary layers can be ground reference layers and other ones of the intermediary layers can be signal routing layers. The signal routing layers and the ground reference layers are often interleaved to reduce noise.

An additional switched voltage trace 146 can be formed in one or more of the intermediary layers 144 as shown in FIG. 1D. The vias 140 which electrically connect the switched voltage trace 110 at the top layer 102 of the circuit board 100 to the switched voltage trace 130 at the bottom outer layer 122 of the circuit board 100 are also electrically connected to the switched voltage trace 146 disposed in the intermediary layer(s) 144 of the circuit board 100. The switched voltage trace 146 disposed in the intermediary layer 144 shown in FIG. 1D is patterned into and electrically insulated from a ground metal trace 148 disposed in the same intermediary layer 144. The other vias 134, 136, 138 which extend through the board 100 from the top outer layer 102 to the bottom outer layer 122 are also electrically insulated from the ground metal trace 148. In another embodiment, the intermediary layer 144 can be a signal routing layer instead of a ground reference layer and the switched voltage trace 146 disposed in the intermediary layer 144 is electrically insulated from the signal lines in that intermediary layer 144. The switched voltage trace 146 can be replicated in one or more intermediary ground reference and/or signaling layers 144 of the circuit board 100 and electrically connected to the same vias 140 as the switched voltage trace 110 at the top outer layer 102 of the circuit board 100, to reduce the resistance of this electrical pathway. In some cases, some of the metal traces or a portion of the metal traces at the backside of the bottom outer layer 102 of the circuit board 100 may be covered with a protective material such as an epoxy. Instead of the protective material covering the surface of the bottommost switched voltage traces 130 which faces outward from the board 100, a thermal interface material such as a thermal tape can contact this surface of the bottommost switched voltage traces 130 to improve the heat transfer characteristics of the board 100.

FIG. 2 illustrates a side-by-side layer view of a multi-layer circuit board to which components of a DC-DC converter power stage are to be attached. The layers 200, 202, 204, 206 are stacked one upon the other, but illustrated side-by-side to show unobstructed details of each layer. The top outer layer 200 of the circuit board includes an input voltage trace 208 which is at the input voltage potential (VIN) of the DC-DC converter, an output voltage trace 210 which is at the regulated output voltage potential (Vout) of the DC-DC converter, one or more ground traces 212 which are at ground potential, and a switched voltage trace 214. The top outer layer 200 of the circuit board also includes various attach regions or pads 216 for attaching different components of the power stage. The bottom outer layer 206 of the circuit board has corresponding input voltage, output voltage, ground, and switched voltage traces 218, 220, 222, 224. In one embodiment, the switched voltage trace 224 disposed at the bottom outer layer 206 of the circuit board is vertically aligned with and has the same shape as the switched voltage trace 214 disposed at the top outer layer 200 of the circuit board.

The circuit board is shown with two intermediary layers 202, 204 interposed between the top and bottom outer layers 200, 206. In general, the circuit board can include more or less than two intermediary layers. In each case, at least one of the intermediary layers 202 can have an additional switched voltage trace 226 which is electrically connected to the same vias 228 as the switched voltage traces 214, 224 at the top and bottom outer layers 200, 206 of the circuit board. The intermediary layer 202 with the additional switched voltage trace 226 can be directly adjacent the top outer layer 200 of the circuit board. The other intermediary layer 204 can be directly adjacent the bottom outer layer 206 and can have a monolithic ground plane 230 through which the vias 228 extend and from which the vias 228 are electrically insulated. Alternatively, the order of the intermediary layers 202, 204 can be reversed so that the layer 202 with the additional switched voltage trace 226 is directly adjacent the bottom outer layer 206 and the intermediary layer 204 with the monolithic ground plane 230 is directly adjacent the top outer layer 200. In some cases, each intermediary layer 202 having an additional switched voltage trace 226 is interposed between adjacent layers 204 having a ground plane 230 for improved noise isolation. In each case, the vias 232 electrically connected to the input voltage traces 208, 218, the vias 234 electrically connected to the output voltage traces 210, 220 and the vias 228 electrically connected to the switched voltage traces 214, 224, 226 are electrically insulated from each intermediary ground plane 230. The vias 236 electrically connected to the ground traces 212, 222 at the top and bottom outer layers 200, 206 are also electrically connected to each intermediary ground plane 230. In general, the circuit board can include one or more intermediary layers having an additional switched voltage trace 226 which is electrically connected to the same vias 228 as the switched voltage traces 214, 224 at the outer layers 200, 206 of the circuit board and which is interposed between an intermediary ground plane 230 and the top or bottom outer layer 200/206. The switched voltage traces 214, 224, 226 disposed in the different layers of the circuit board can be vertically aligned with each other and have the same shape.

Figure 3:
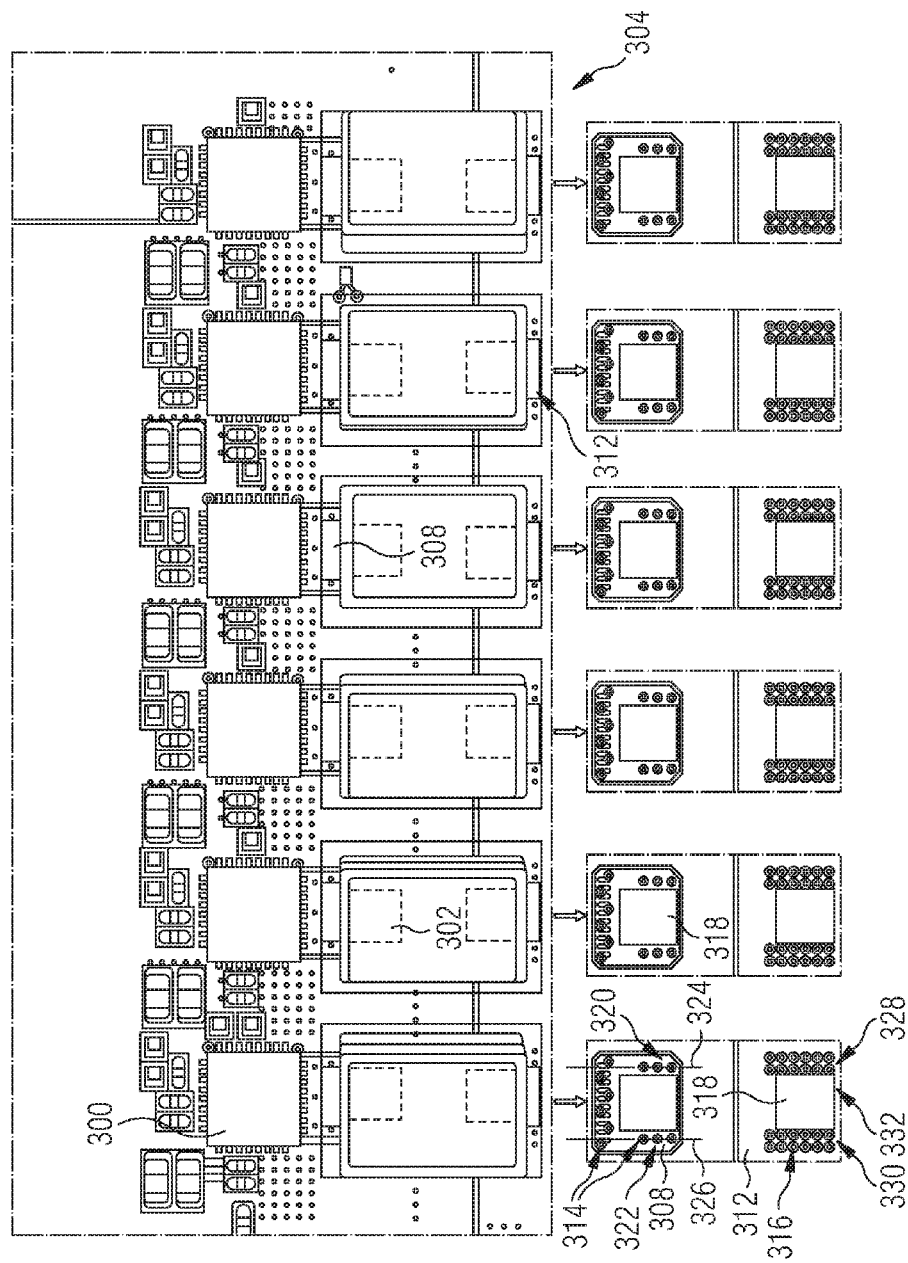
FIG. 3 illustrates a plan view of an embodiment of a circuit board after power stages and corresponding inductors of a DC-DC converter are attached to the top outer layer of the board, according to an embodiment.

FIG. 3 illustrates a top-down plan view of a circuit board of the kind previously described herein, after the power stages 300 and corresponding inductors 302 are attached to the top outer layer 304 of the board. In this case, each power stage 300 includes at least a pair of high-side and low-side power transistors integrated in the same semiconductor die. Alternatively, the power transistors of each phase can be provided in separate discrete dies. In either case, a first terminal 306 of each inductor 302 is attached to the corresponding switched voltage trace 308 and a second terminal 310 of the inductor 302 is attached to the corresponding output voltage trace 312 for that phase. The inductor terminals 306, 310 are out-of-view in top half of FIG. 3 and therefore illustrated with dashed boxes. Each section of the circuit board to which one of the inductors 302 is attached is reproduced along the bottom half of FIG. 3 prior to attachment of the power stages 300 and inductors 302, to illustrate the position of the vias 314 electrically connected to the switched voltage traces 308 and the position of the vias 316 electrically connected to the output voltage traces 312 with respect to the inductor terminals 306, 310. The top outer layer 304 of the circuit board has various attach regions or pads 318 for attaching the terminals 306, 310 of the inductors 302.

A first group 320 of the vias 314 electrically connected to the switched voltage traces 308 is disposed along a first side of the first terminal 306 of each inductor 302. A second group 322 of the vias 314 electrically connected to the switched voltage traces 308 is disposed along a second side of the first terminal 306 of each inductor 302 opposite the first side of the first terminal 306. In one embodiment, the group 320 of vias 314 disposed along the first side of the first terminal 306 of each inductor 302 is aligned along a first center line 324. The group 322 of vias 314 disposed along the second (opposite) side of the first terminal 306 of each inductor 302 is aligned along a second center line 326 which runs parallel with the first center line 324.

A first plurality of additional vias 328 is disposed along a first side of the second terminal 310 of each inductor 302, and a second plurality of additional vias 330 is disposed along a second side of the second terminal 310 of each inductor 302 opposite the first side of the second terminal 310. The additional vias 328, 330 extend through the circuit board and are electrically connected to the output voltage metal traces 312 at both sides (the bottom side of the circuit board is shown in FIG. 3).

In an embodiment, a part 332 (also known as inductor footprint or footprint landing pattern) of the circuit board covered by the first terminal 310 of each inductor 302 is devoid of the vias 328, 330. Such a configuration provides for an open current channel 412 in each ground reference plane under the inductors 302 as shown in FIG. 4.

FIG. 4 shows an intermediary layer 400 of a circuit board. The intermediary layer 400 has a monolithic ground plane 402. All vias 404, 406, 408 except the vias 410 electrically connected to ground potential are insulated from the ground plane 402. The part 412 of the intermediary circuit board layer 400 covered by the first terminal of each power stage inductor (out of view) is devoid of vias. FIG. 4 also shows the on and off states of the corresponding power stage transistors. When high-side transistor 'Upper FET' is on, the load return ground current 414 closes the loop at the input supply VIN as shown in the upper circuit schematic. When low-side transistor 'Lower FET' is on, the output current flows from the load back to ground through the corresponding vias 410 to close the current loop 416 on the power stage as shown in the lower circuit schematic. When the output current leaves the power stage on the top circuit board layer (out of view), the current passes through the load and drops e.g. 3 to 5 mils down to the intermediary internal ground layer 400 shown in FIG. 4 and precisely mirrors high density output currents 416 back to the power stage. The ground vias 410 under the power stage (out of view) and to the left and right of the power stage provide the shortest current loop and improve thermal performance of the power stage. Eliminating vias from the part 412 of the intermediary circuit board layer 400 covered by the first terminal of each power stage inductor further enhances the electrical and thermal performance of the system.

Each power stage of the DC-DC converters previously described herein can be attached to a substrate using any standard die attach processes such as soldering, sintering, etc.

FIGS. 5A through 5C illustrate an embodiment of soldering each power stage to the first side of a substrate. FIG. 5A shows a solder paste stencil 500 applied to the first side of a substrate in a region of the substrate to which a power stage of a DC-DC converter is to be attached. The solder paste stencil 500 has a plurality of openings 502 which do not expose the vias 504 under the power stages (not shown), so that the vias 504 remain covered by the solder paste stencil 500 and are positioned at facing corners of the openings 502. FIG. 5B shows a solder mask 506 used to apply solder paste 508 to the substrate with the solder paste stencil 500. FIG. 5C shows the region of the substrate 510 to which the power stage is to be attached, after the solder paste 508 is applied via the solder mask 506 through the openings 502 in the solder paste stencil 500. By positioning the vias 504 under the power stage such that the vias 504 remain covered by the solder paste stencil 500 and at facing corners of the openings 502 in the solder paste stencil 500, solder is prevented from filling the inside of the vias 504. The power stage is then placed on the solder paste 508 which is reflowed to attach the power stage to the corresponding metal traces (out of view) of the circuit board 510.

Figure 6:
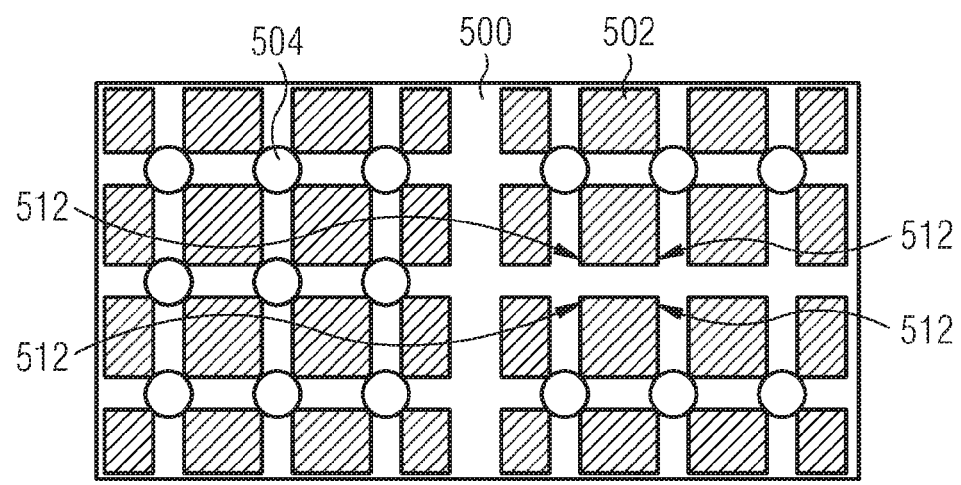
FIG. 6 illustrates a plan view of an embodiment of a solder paste stencil used in soldering power stages of a DC-DC converter to a side of a substrate, according to an embodiment.

FIG. 6 illustrates an embodiment of the solder paste stencil 500 with the underlying vias 504 superimposed to show in greater detail that the openings 502 in the solder paste stencil 500 do not expose the vias 504 under the power stages. This way, the vias 504 under each power stage remain covered by the solder paste stencil 500 and are positioned at facing corners 512 of the openings 502.

Figure 7:
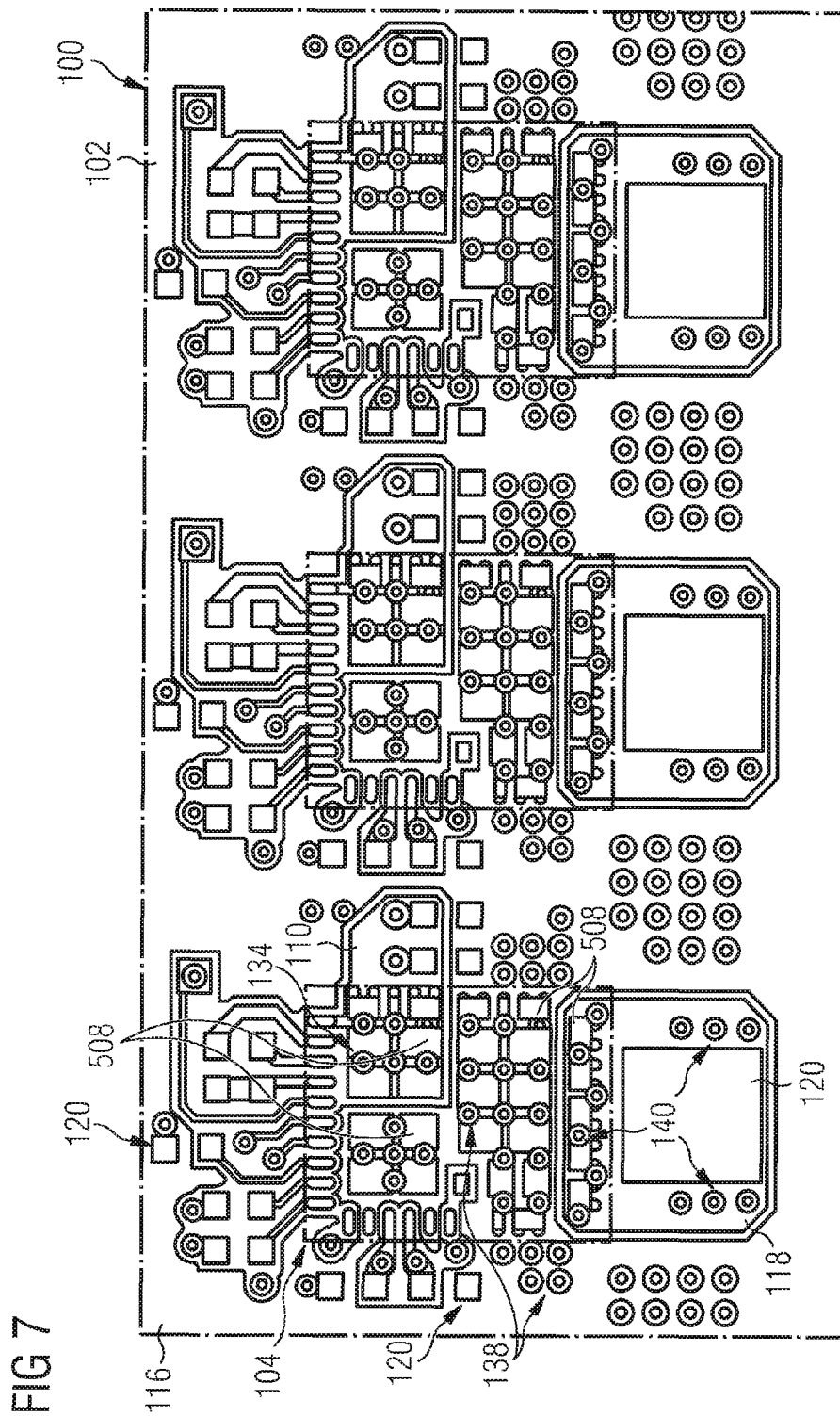
FIG. 7 shows the section of the top outer layer of the substrate illustrated in FIG. 1A, after application of solder paste using a solder paste stencil.

FIG. 7 shows the section of the top outer layer 102 of substrate 100 illustrated in FIG. 1A, after application of solder paste 508 using a solder paste stencil 500 of the kind described above. According to this embodiment, the vias 134, 138, 140 under each power stage (represented by footprint 104) are positioned at facing corners of the solder paste 508 applied to the top outer layer 102 of the substrate 100.

Figure 8D:
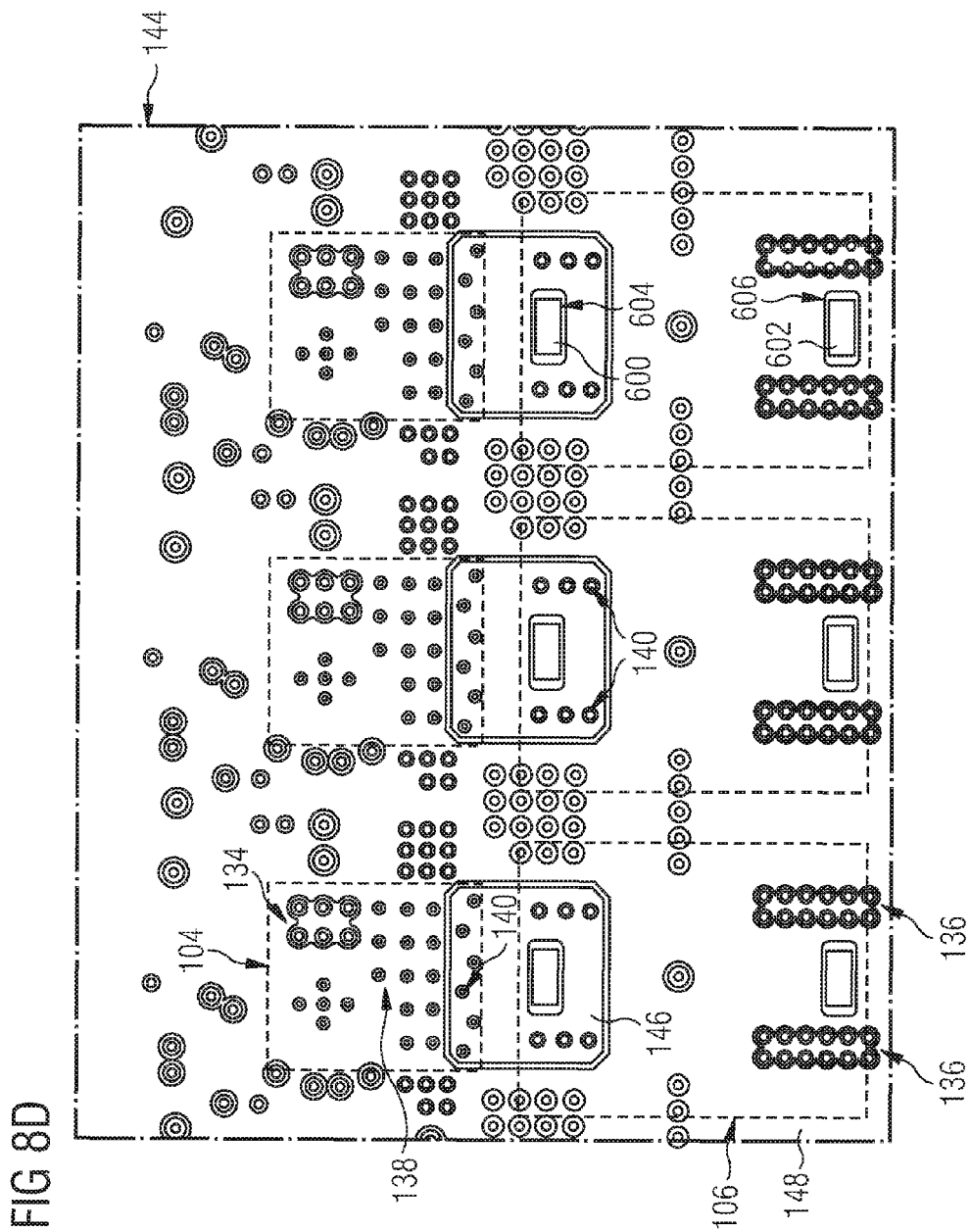
FIG. 8D illustrates a plan view of a section of an intermediary layer of the substrate of FIG. 8A.

FIGS. 8A through 8D illustrate another embodiment of the substrate 100 shown in FIGS. 1A through 1D. The substrate 100 is implemented as a PCB in this example. FIG. 8A illustrates the top outer layer 102 of the substrate 100 prior to attachment of the power stage components, FIG. 8B illustrates the top outer layer 102 after attachment of the output inductors 108, FIG. 8C illustrates the bottom outer layer 122 of the substrate 100, and FIG. 8D illustrates an intermediary layer 144 of the substrate 100. According to this embodiment, the inductor and power stage components are placed on the same side 102 of the substrate 100 but the terminals 600, 602 of the inductors 108 are soldered on the opposite side 122. To this end, the inductors 108 are through-hole inductors. The terminals 600, 602 of the through-hole inductors 108 are inserted in respective openings 604, 606 formed in the substrate 100. The openings 604, 606 extend to the bottom side 122 of the substrate 100. The terminals 600, 602 are connected to respective attach regions or pads 120 at the bottom side 122 of the substrate 100 e.g. by soldering to complete the corresponding electrical phase connections e.g. as schematically shown in FIG. 1C.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A DC-DC converter, comprising:
a substrate having opposing first and second sides;
a power stage attached to the first side of the substrate, the power stage comprising active semiconductor components operable to provide an output phase of the DC-DC converter;
a discrete inductor individually separate and distinct from the substrate and the power stage, the discrete inductor attached to the first side of the substrate and electrically connected to the power stage through a first metal region at the first side of the substrate; and
a plurality of electrically conductive vias extending through the substrate from the first side to the second side,
wherein the vias are electrically connected to the first metal region,
wherein at least some of the vias are disposed at least partly under the power stage,
wherein a first terminal of the discrete inductor is attached to the first metal region,
wherein a first group of the vias is disposed along a first side of the first terminal and a second group of the vias is disposed along a second side of the first terminal opposite the first side of the first terminal,
wherein a second terminal of the discrete inductor is attached to an output voltage metal region at the first side of the substrate,
wherein the output voltage metal region is spaced apart and electrically isolated from the first metal region,
wherein a first plurality of additional vias is disposed along a first side of the second terminal,
wherein a second plurality of additional vias is disposed along a second side of the second terminal opposite the first side of the second terminal,
wherein the first plurality and the second plurality of additional vias extend through the substrate from the first side to the second side.

2. The DC-DC converter of claim 1, wherein the vias disposed at least partly under the power stage are arranged in a staggered manner.

3. The DC-DC converter of claim 1, wherein a part of the substrate covered by the first terminal of the discrete inductor is devoid of the vias.

4. The DC-DC converter of claim 1, wherein the first group of the vias is aligned along a first center line and the second group of vias is aligned along a second center line which runs parallel with the first center line.

5. The DC-DC converter of claim 1, wherein the vias extend from the first metal region at the first side of the substrate to a second metal region at the second side of the substrate, and wherein the vias are electrically connected to the second metal region.

6. The DC-DC converter of claim 5, wherein the second metal region is vertically aligned with the first metal region and has the same shape as the first metal region.

7. The DC-DC converter of claim 5, wherein the substrate is a circuit board, wherein the first metal region is disposed in a first outer layer of the circuit board, and wherein the second metal region is disposed in a second outer layer of the circuit board.

8. The DC-DC converter of claim 7, wherein the vias extend through and are electrically connected to a third metal region disposed in a first intermediary layer of the circuit board which is interposed between the first and the second outer layers.

9. The DC-DC converter of claim 8, wherein the third metal region is patterned into and electrically insulated from a ground metal region disposed in the first intermediary layer.

10. The DC-DC converter of claim 8, wherein the first intermediary layer is directly adjacent the first outer layer of the circuit board.

11. The DC-DC converter of claim 8, wherein the circuit board comprises a second intermediary layer interposed between the first intermediary layer and the second outer layer, wherein a ground metal region is disposed in the second intermediary layer, and wherein the vias extend through and are electrically insulated from the ground metal region disposed in the second intermediary layer.

12. The DC-DC converter of claim 8, wherein the circuit board comprises a second intermediary layer interposed between the first intermediary layer and the first outer layer, wherein a ground metal region is disposed in the second intermediary layer, and wherein the vias extend through and are electrically insulated from the ground metal region disposed in the second intermediary layer.

13. The DC-DC converter of claim 8, wherein the first metal region, the second metal region and the third metal region are vertically aligned with each other and have the same shape.

14. The DC-DC converter of claim 1, wherein the discrete inductor is a through-hole inductor having terminals which extend through the substrate to the second side.

* * * * *